(12) United States Patent
Wu et al.

(10) Patent No.: US 7,080,448 B2
(45) Date of Patent: Jul. 25, 2006

(54) PCB WITH INLAID OUTER-LAYER CIRCUITS AND PRODUCTION METHODS THEREOF

(76) Inventors: Hsueh-Fang Wu, 4F, 25, Alley 5, Lane 266, Shih-Dong Road, Taipei (TW) 111; Hsiao-Che Wen, 10F, No 37, Hsin-Fu 3rd St., Ping-Chen City, Tao-Yuan Hsien (TW)

( * ) Notice: Subject to any disclaimer, the term of this patent is extended or adjusted under 35 U.S.C. 154(b) by 269 days.

(21) Appl. No.: 10/375,361

(22) Filed: Feb. 28, 2003

(65) Prior Publication Data
US 2004/0168312 A1 Sep. 2, 2004

(51) Int. Cl.
*H01K 3/10* (2006.01)

(52) U.S. Cl. .............................. 29/852; 29/846; 427/97; 427/99

(58) Field of Classification Search .................. 29/846, 29/852; 427/97, 99
See application file for complete search history.

(56) References Cited
U.S. PATENT DOCUMENTS
4,925,705 A * 5/1990 Hill .............................. 427/259

* cited by examiner

*Primary Examiner*—Richard Chang
(74) *Attorney, Agent, or Firm*—Johnson & Associates, PC; Chauncey B. Johnson, Esq.

(57) ABSTRACT

Method for fabricating printed circuit board employing optical engraving and metallization techniques to form a pre-designated circuit pattern on a transfer plate, wherein the pattern is transferred and inlaid to a dielectric material by lamination, a printed circuit is emerged after removal of said transfer plate and surface copper deposit is etched off. PCB produced by the present invention and characterized by its outer layer circuitry is inlaid into the dielectric material, thus having 3-sided adhesion between the circuitry and the dielectric material.

4 Claims, 4 Drawing Sheets

PCB WITH INLAID OUTER-LAYER CIRCUITS AND PRODUCTION METHODS THEREOF

FIELD OF THE INVENTION

This invention relates in general to methods for producing printed circuit boards and to printed circuits board produced by the method of this invention. In particular, it relates to a new method of forming outer-layer circuit lines that are inlaid into the dielectric layer.

BACKGROUND OF THE INVENTION

Typically, a printed circuit board (hereinafter referred to as PCB) is comprised of at least one layer of dielectric substrate, usually fabricated from epoxy coated glass fabric and one or two sides of thin layer of predetermined pattern of metallic traces, such as copper. Interconnections between the layers of metallic circuitry are often required to enforce electrical communication between the various metallic layers. Pursuant to the existing prior art printed circuit boards are produced by laminating layers of copper foils to a dielectric substrate to form a copper clad laminate. That copper clad laminate is further processed to convert the copper foils into predetermined circuit patterns by selectively removing portions of the copper foils through the use of chemical etching techniques. PCBs produced by conventional, prior art processes are characterized by outerlayer circuits bonded on top of the dielectric substrate as shown in FIG. 1. However, conventional approaches have several shortcomings. As an example etchants must remove large amount of copper, which increases both manufacturing costs and waste disposal costs. A further disadvantage regarding conventional methods is that existing etchants do not create vertical sides of the circuit lines. Instead, these etchants tend to etch away too much copper at the top and too little copper at the bottom of the circuit lines, creating a trapezoidal-shaped circuit lines, and resulting in a phenomenon described in the industry as the etching factor effect. As a result, the minimum width of the circuit lines and the minimum spaces between circuit lines are limited due to uneven and inaccurate etching. An approach to improving the accuracy of the circuit lines is to use thinner copper foil, which are capable of being quickly etched with less undercutting. However, such thin copper foils are not only expensive but also difficult to handle. For much thinner copper foil a carrier layers is usually applied to improve operability, one such example is found in U.S. Pat. No. 3,998,601 in which a thin copper foil is deposited on a supportive thick copper foil and then separated from the thick copper foil by a release layer.

Another known alternative method for forming fine-line patterns is shown in U.S. Pat. No. 6,117,300 to Carbin et al. According to the technique of Carbin et al., a thin conductive layer is applied to a substrate using a foil carrier; a photoresist may then be applied, imaged, and cured. The uncured photoresist may be removed, thereby defining some exposed regions or on the surface of the substrate in which the circuit lines are to be formed. Since the conductive layer is now exposed, it is possible to selectively apply the circuit lines in those exposed regions. Finally, the cured photoresist is removed and the exposed conductive metal layer beneath the photoresist is removed, leaving the finished circuit pattern. An earlier technique for fabricating printed circuit boards by pattern plating process is described in the U.S. Pat. No. 5,733,468 issued to Conway. In accordance with the latter technique Conway teaches, a thin, first layer of copper foil being bonded to the surface of the board, then a photoresist layer is laminated over the copper layer, and wherein the photoresist is selectively exposed and developed to define the desired pattern of traces. A thick, second layer of copper is electrodeposited on the traces and the photoresist is then removed. The board is etched to remove those portions of the first copper layer that are not covered by the second copper layer, and thus leaving the finished circuit pattern.

As circuit lines become finer, an obvious disadvantage, of the aforementioned techniques is that the copper traces may not adhere sufficiently to the dielectric layer, which may be peeled off from the dielectric layer during surface conditioning, such as brushing prior to soldermask printing. An improved technique also known as "imprint patterning" is described in U.S. Pat. No. 6,005,198 issued to Gregoire. Pursuant to the teachings of Gregoire, a U-shape recessed pattern of circuitry is formed on the surface of a compressible substrate via a stamping process, then a conducter is disposed on the surface of the recessed pattern by electroplating or metal transfer. While Gregoire technique has advantages in forming circuit lines and micro-vias integrally, the need for new substrate material, and the reduction in fidelity and reliability of the delicate mold after repetitive stamping are examples of disadvantages. Other disadvantage associated with fine line printed circuit board are its irregular and zigzag surface formed by the dense circuit lines, the difficulties associated with filling soldermask and air entrapment along the narrow spaces of the finer circuit pattern, which result in bubbling, blistering or delaminating of soldermask upon passing the solder bath. A further disadvantage of the conventional techniques in forming very thin multilayer PCB is that the copper clad laminate tends to shrink and warp after exposure to chemicals and/or high temperature, resulting in mismatch of circuit lines of different layers. All these shortcomings result in numerous quality control problems and require costly capital equipment and manufacturing tolerance.

Bearing the aforementioned shortcomings in mind, consequently, there exists a need for PCB with inlaid outer-layer circuits which use economical and reliable production methods and capable of overcoming the above-identified shortcomings.

OBJECT OF THE INVENTION

A primary object of this invention is to disclose a printed circuit board whose outerlayer circuits is inlaid into the adjecent dielectric substrate.

Another object of this invention is to disclose a printed circuit board whereby complex, irregular and intricate circuit lines are inlaid into the dielectric substrate; thus a flat surface is obtained.

Yet another object of this invention is to disclose a printed circuit board whereby the thickness of the board is the sum of the thickness of dielectric layers and the thickness of protective surface coatings.

A further object of this invention is to disclose a method of fabricating a printed circuit board with inlaid outlayer circuits.

Still another object of this invention is to disclose a method of fabricating a printed circuit board that overcomes the above-identified shortcomings.

Yet another object of this invention is to disclose a method for fabricating a printed circuit board that eliminates usage of costly thin copper foil and thin copper clad laminate.

These and other advantages, features, and objects of this invention will be more easily understood in view of the following detailed description and drawings.

SUMMARY OF THE INVENTION

In view of the foregoing background, the present invention aims to provide a circuit board that enhances the bonding strength of circuit traces to the dielectric substrate and eliminates the irregularities associated with board surfaces. None of the prior art references uncovered in the search teaches a method for fabricating PCB in accordance with the sequence of steps in the present invention, which produces PCB features with inlaid outer-layer circuits. In particular, the present invention eliminates many of the shortcomings associated with conventional etching and pattern plating methods.

In accordance with a first aspect of the present invention, a printed circuit board having outerlayer circuit lines inlaid into the dielectric substrate is provided. The printed circuit board is fabricated by forming a predetermined pattern of circuitry on a metal transfer plate, then the circuitry is transferred to a dielectric substrate through a lamination technique. A drilling and through-hole metallization may be applied to interconnect circuit lines of various metallic layers.

In accordance with a second aspect of the present invention, a first method of fabricating PCB with inlaid outer-layer circuit is provided. The method includes forming a thin conductive metal layer, typically copper, on a smooth surface of a metal transfer plate. A photoresist may then be applied, imaged, and cured (cross-linked). The uncured photoresist is removed; thereby defining some exposed regions on the surface of the conductive metal layer or "trenches" in which circuit lines are to be formed. Selectively, metal is deposited in the trenches to the required thickness by known metallization techniques known in the art. Finally, the cured photoresist is removed, a layer of prepreg (semi-cured dielectric substrate) is applied between two metal transfer plates such that circuits are facing towards the prepreg, and then a pin lamination process may be applied to inlay the circuits into the dielectric substrate. After removing the metal transfer plates and etching away the covering thin conductive metal layers, a printed circuit board is formed with predetermined patterns of circuits. A drilling and through-hole metallization may be applied to interconnect circuit lines of various metallic layers.

A second method of fabricating PCB with inlaid outer-layer circuit according to the present invention is provided. The method includes forming a conductive metal layer, typically copper, on a smooth surface of a metal transfer plate. A layer of tin or eutectic alloy of tin may then be applied over the conductive metal layer. Portions of tin or tin alloy are selectively removed by laser ablation so that required circuit pattern are covered by tin or tin alloy, and then the conductive metal layer are removed and exposed. Afterwards, an etching process may then be applied to remove the layer of tin or tin alloy. A thin layer of copper is formed to cover the surface of the metal transfer plate and circuit pattern. Finally, a layer of prepreg is applied between two metal transfer plates with circuits facing towards the prepreg layer, and then a pin lamination process may be applied to inlay the circuits into the dielectric substrate. After removing the metal transfer plates and etching away the covering thin conductive metal layers, a printed circuit board with predetermined patterns of circuits is formed. A drilling and through-hole metallization may be applied to interconnect circuit lines of various metallic layers.

It will be understood by those skilled in the art that the copper and other conductive metals may be formed to the respective surfaces by any conventional method including, but not limited to electroplating, electrolytic deposition, electroless deposition, chemical vapor deposition, sputtering or a combination thereof.

DETAILED DESCRIPTION OF THE INVENTION

Figure 1:
FIG. 1 illustrates a cross-sectional view of the circuit lines of a printed circuit fabricated in accordance with the prior art.

With reference to the drawings, FIG. 1 represents a prior art double-sided printed circuit board. The prior art circuit board shows a core layer with circuit lines bonded on the surfaces of both sides. Typically a core is comprised of epoxy coated glass fabric for forming a rigid substrate. The board may be laminated to form a multi-layer structure using a layer of copper foil and a bonding sheet known as prepreg. A circuit pattern is produced thereon by any suitable fabricating technique. Those skilled in the art will understand that the circuit lines may not adhere sufficiently to the substrate, this can lead to problems such as the peel off of the circuit lines.

Figure 2:
FIGS. 2 and 3 illustrate a cross-sectional view of a circuit fabricated in accordance with an embodiment of the present invention.
Figure 3:
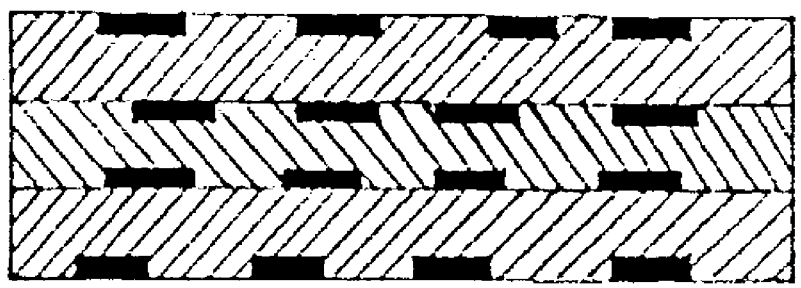

FIGS. 2 and 3 illustrate preferred embodiments of printed circuit boards in accordance with the present invention. The circuit lines of outmost layers are inlaid into the dielectric substrate, thus having 3-side adhesion between a circuit line and the substrate. The irregular zigzag surface associated with the printed circuit board fabricated in accordance with the prior art is eliminated and a flat and a smooth surface is achieved.

Figure 4A:
FIGS. 4A–4J are a series of cross-sectional views showing in series a printed circuit at various stages during fabrication in accordance with a method/process of present invention.

FIGS. 4A–4J illustrates a first method of producing a printed circuit board with inlaid circuits of the present invention, this illustrated method is particularly advantageous when used to fabricate the outer circuit layers of multilayer circuit boards, but may also be used for inner layers. As shown in FIG. 4A, the process can begin by forming a thin conductive metal layer (CU), typically copper, but may be aluminum gold or the like, onto a clean and a smooth surface of a metal transfer plate (RMP). Simple methods of forming a thin conductive metal layer include electroplating or electroless plating, etc. Other metallization techniques such as chemical vapor deposition, sputtering, or the like can be used as alternatives to plating.

Figure 4B:
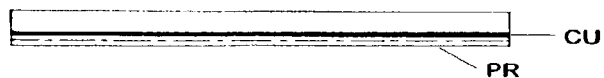
Figure 4C:
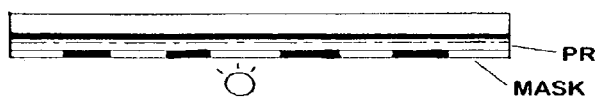
Figure 4D:
Figure 4E:
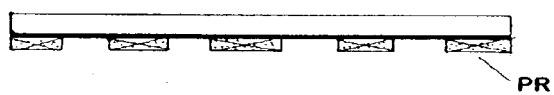
Figure 4F:
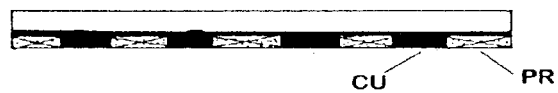
Figure 4G:
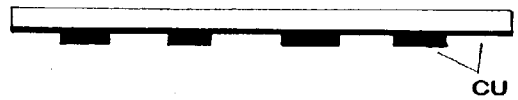
Figure 4H:
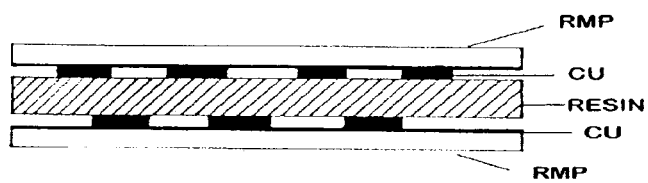
Figure 4I:
Figure 4J:

A layer of photoresist (PR) is applied on top of the thin metal layer as shown in FIG. 4B, and the photoresist is selectively exposed according to a predetermined pattern as shown in FIG. 4C, so that portions of the photoresist are cured as shown in FIG. 4D. The uncured photoresist is removed so that the cured photoresist forms some trenches that define the pattern of circuit lines, which is shown in FIG. 4E. Next a second conductive metal layer (CU) of a desired thickness is formed as shown in FIG. 4, and the photoresist is removed completely leaving the circuit pattern (CU) on said transfer plate as shown in FIG. 4G. The semi-cured dielectric substrate or named prepreg (RESIN) is then interposed between two transfer plates with circuits facing towards the prepreg, as illustrated in FIG. 4H. At this junction, the circuit patterns to said dielectric substrate is transferred via pin lamination and said transfer plates are removed as shown in FIG. 4I. The covering first conductive metal layers is then etched away, leaving circuits inlaid into the dielectric substrate as shown in FIG. 4J. Though-hole platings are selectively drilled on portions of the board to interconnect circuit lines on both sides of said substrate. The board is then cleaned and a soldermask may be applied. The finishing steps, including as gold tab printing for edge connector or legend printing may be applied to complete the printed circuit board.

Alternatively, in the above pattern metallization process, a positive type photoresist may be applied whereby the portions exposed to radiation will be decomposed and removed. After exposure, the decomposed photoresist is removed thereby forming trenches that then are deposited with conductive metal to form circuits.

Figure 5A:
FIGS. 5A–5I are a series of cross-sectional views showing in series a printed circuit at various stages during fabrication in accordance with an alternate method/process of the present invention.
Figure 5B:
Figure 5C:
Figure 5D:
Figure 5E:
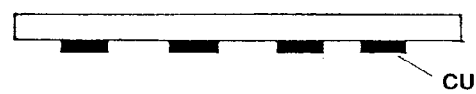
Figure 5F:
Figure 5G:
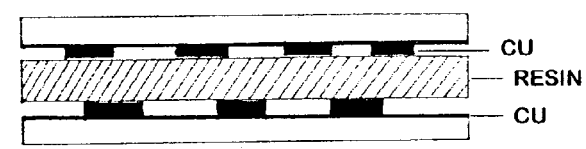
Figure 5H:
Figure 5I:

FIGS. 5A–5I illustrate a second method of producing a printed circuit board with inlaid circuits according to the present invention. The latter method is particularly advantageous when used to make the outer circuit layers of multilayer circuit boards, but may also be used for inner layers. As shown in FIG. 5A, the process can begin by forming a conductive metal layer (CU), typically copper, but may be aluminum, gold or the like, onto a clean and smooth surface of a metal transfer plate (RMP). Simple methods of forming a thin conductive layer include electroplating or electroless plating. Other metallization techniques such as chemical vapor deposition, sputtering, or the like can be used as alternative to plating, etc. Next a layer of tin or eutectic tin alloy (SN) is applied over said first metal layer as shown in FIG. 5B. Portions of the tin layer are selectively removed by laser ablation to expose portions of the first metal layer outside the predetermined pattern of the circuit as shown in FIG. 5C. Then portions of metal layer not covered by tin layer are removed as shown in FIG. 5D. The remaining tin layer are removed chemically, leaving the circuit pattern on said transfer plate as shown in FIG. 5E. A thin layer of conductive metal (CU) is then formed on the surface of the transfer plate and the circuits as shown in FIG. 5F. The semi-cured dielectric substrate or named prepreg are interposed by stacking between two transfer plates with circuits facing the prepreg as shown in FIG. 5G. The circuit patterns is then transferred to said dielectric substrate via pin lamination as shown in FIG. 5H. Transfer plates are removed by etching away the covering thin conductive metal layers, thereby leaving circuits inlaid into the dielectric substrate as shown in FIG. 5I. Through-hole plating are selectively drilled on portions of the board to interconnect circuit lines on both sides of said substrate. The board is then cleaned and a soldermask may be applied. The finishing steps, such as gold tab printing for edge connector or legend printing may be applied to complete the printed circuit board.

Figure 6A:
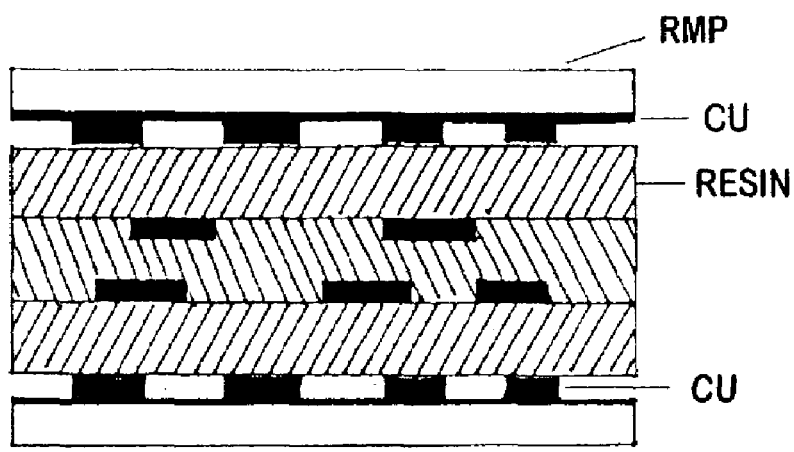
FIGS. 6A–6C are a series of cross-sectional views showing in series a multilayer printed circuit at various stages during fabrication in accordance with a method/process of present invention.
Figure 6B:
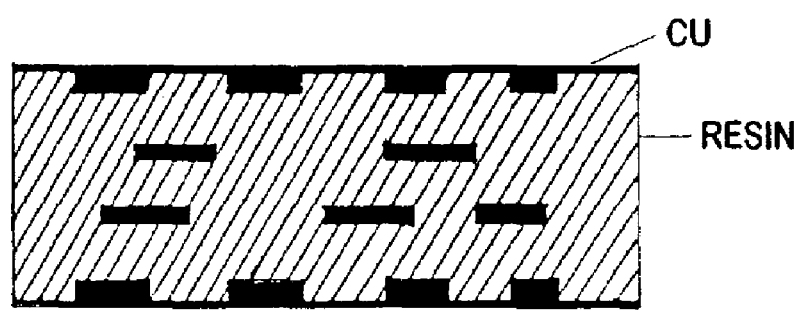
Figure 6C:
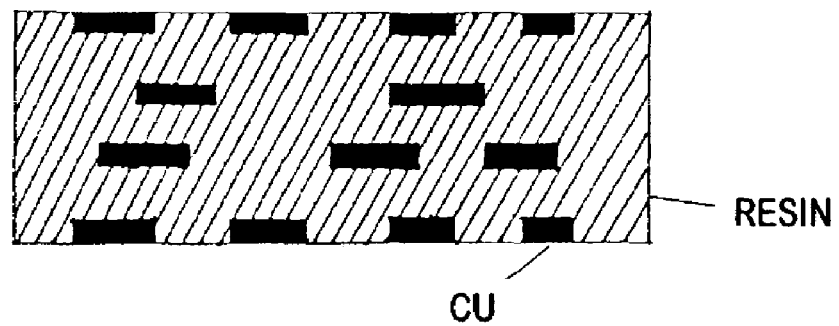

FIGS. 6A–6C illustrate a method of fabricating a multilayer of printed circuit board in accordance with the present invention. The two outmost circuit layers may be prepared according to above-mentioned first method or second method of the present invention. These layers are then stacked with pre-fabricated inner layers and layers of prepreg as shown in FIG. 6A. The circuit patterns to the dielectric substrate are then transferred via pin lamination, and the transfer plates are removed as shown in FIG. 6B. The thin covering conductive metal layers are etched away, leaving circuits inlaid into the dielectric substrate as shown in FIG. 6C. Through-hole plating are selectively drilled on portions of the board to interconnect circuit lines with each other. The board is then cleaned and a soldermask may be applied. The finishing steps, such as gold tab printing for edge connector or legend printing may be applied to complete the printed circuit board. The material of the dielectric substrate can be freely selected to comply with various requirements of the electrical, the physical or the thermal properties.

In accordance with the embodiments described above, all types of printed circuit boards having inlaid outerlayer circuits can be produced according to the present invention. Circuit boards using the method-process of the present invention is characterized by being at least one of the outmost wiring circuits inlaid in the substrate. The method of the present invention ensures accurate production of circuit lines and, thus, a circuit designer does not have to compensate for the inaccuracy inherent in the formation of circuit line by etching. This means the resulting circuit lines can be finer and more compact. The method provided by the present invention is capable of forming circuit line width of 0.001–0.002 inches, whereas prior art subtractive etching methods are generally limited to forming circuits having line width of 0.003–0.004 inches. As noted above, a further advantage of the preferred embodiments is improved bonding of circuit lines.

Those skilled in the art should appreciate that there are a large number of types of printed circuit boards that can be fabricated using the method provided herein. The above disclosure sets forth a number of embodiments of the present invention. Other arrangements or embodiments, not precisely set forth, could be practiced under the teaching of the present invention. It is recognized, however, that many changes and modifications may be carried out without departing from the spirit and the scope of the present invention described, and all changes which come within the meaning and range of equivalency of the claims are intended to be embraced therein.

We claim:

1. A method for fabricating printed circuit boards comprising:
    (a) forming a first layer of conductive metal to transfer plate;
    (b) applying a layer of tin or a layer of eutectic tin alloy over said first layer;
    (c) removing selective portions of tin layer by laser ablation thereby exposing corresponding portions of the underneath metal layer;
    (d) removing portions of the conductive metal layer not covered by tin layer;
    (e) removing remaining thin layer chemically and leaving the circuit pattern on said transfer plate;

(f) forming a thin layer of conductive metal on the surface of said transfer plate and said circuit;
(g) laminating the transfer plate to a layer of semi-cured prepreg with circuits facing to said prepreg;
(h) removing said transfer plate, etching away thin covering conductive metal layers, and leaving circuits inlaid in the surface of the dielectric substrate; and
(i) drilling holes through the board selectively and forming metal along the walls of the holes to interconnect circuit lines on both sides of said substrate.

2. The method according to claim 1 wherein step (g) comprising at least one pre-fabricated inner circuit layers interposing between layers of prepeg.

3. The method for manufacturing printed circuit boards according to claim 1 comprising a dielectric substrate; circuits formed on one or both sides of the dielectric substrate; and a conductor for electrically connecting the circuits on both sides of the substrate with each other, wherein at least one side of the circuits is inlaid into the substrate.

4. The method for manufacturing printed circuit boards according to claim 1, wherein at least one of said outmost layer circuits is inlaid into the dielectric substrate.

* * * * *